United States Patent [19]
Beigel et al.

[11] Patent Number: 5,477,078
[45] Date of Patent: Dec. 19, 1995

[54] INTEGRATED CIRCUIT (IC) WITH A TWO-TERMINAL DIODE DEVICE TO PROTECT METAL-OXIDE-METAL CAPACITORS FROM ESD DAMAGE

[75] Inventors: David F. Beigel, Swampscott; William A. Krieger, North Andover; Susan L. Feindt, Boston, all of Mass.

[73] Assignee: Analog Devices, Incorporated, Norwood, Mass.

[21] Appl. No.: 363,384

[22] Filed: Dec. 23, 1994

Related U.S. Application Data

[63] Continuation of Ser. No. 198,856, Feb. 18, 1994, abandoned.
[51] Int. Cl.⁶ .................................................. H01L 29/90
[52] U.S. Cl. ............................................ 257/606; 257/603
[58] Field of Search ................................ 257/603, 605, 257/606, 355

[56] References Cited

U.S. PATENT DOCUMENTS

| | | | |
|---|---|---|---|
| 4,724,471 | 2/1988 | Leuschner. | |
| 5,276,350 | 1/1994 | Merrill et al. | 257/605 |
| 5,298,788 | 3/1994 | Moreau | 257/606 |
| 5,414,295 | 5/1995 | LeRoux et al. | 257/606 |

FOREIGN PATENT DOCUMENTS 2130792  6/1984  United Kingdom .................. 257/606

*Primary Examiner*—Gene M. Munson
*Attorney, Agent, or Firm*—Parmelee, Bollinger & Bramblett

[57] ABSTRACT

An ESD protective clamp device comprised of a two-terminal diode formed in an isolated chip cell. The lower part of this chip cell region contains a buried layer of silicon with P-type dopant, and the upper part is an epitaxial layer also with P-type dopant. An annular (ring-shaped) anode plug segment is formed at the outer reaches of the epitaxial layer with P+ doping. At the interior central region is an N-type plug circular in horizontal cross-section and concentric with the annular plug. This central plug serves as the cathode. Electrical connections are made to anode and cathode to provide interconnection with an IC circuit with a MOM capacitor to be protected.

8 Claims, 2 Drawing Sheets

INTEGRATED CIRCUIT (IC) WITH A TWO-TERMINAL DIODE DEVICE TO PROTECT METAL-OXIDE-METAL CAPACITORS FROM ESD DAMAGE

This application is a continuation of application Ser. No. 08/198,856 as originally filed on Feb. 18, 1994, now abandoned.

BACKGROUND OF THE INVENTION

1. Field of the Invention

This invention relates to integrated circuits (ICs) comprising a substrate carrying a large number of circuit elements including metal-oxide-metal (MOM) capacitors. More particularly, this invention relates to such ICs having means to reduce damage to the capacitors from the effects of electrostatic discharge (ESD).

2. Prior Art

It is well known that ICs are subject to serious damage or destruction as a result of Electrostatic Discharge (ESD) events. The electrostatic charge associated with the discharge can be developed by any of many sources, such as lightning, friction between insulating bodies such as synthetic fiber clothing, and contact with automated chip handling apparatus. Damage occurs when the ESD voltage is accidentally coupled to one of the circuit terminal points to cause a large pulse of current to flow through some portion of the metal interconnect of the chip to a sensitive circuit element of the IC such as a MOM capacitor. Such capacitors, as formed by certain processes, are especially susceptible to oxide punch through, particularly when the ESD energy presents a very fast transient (e.g., with rise times less than 1 nsec). Such transients can be simulated for test purposes by the so-called Charge Device Model (CDM).

In a co-pending application filed by D. Beigel, E. Wolfe and W. Krieger, there is disclosed a diode-connected transistor especially suitable for protecting bipolar junctions, thin film resistors and diffused resistors from damage. That protective device establishes a voltage barrier of about 30–35 volts for protecting the IC elements. However, such a relatively high voltage level is not appropriate for protecting MOM capacitors. The present invention provides a two-terminal diode configuration having characteristics more suitable for protecting such capacitors from ESD damage.

SUMMARY OF THE INVENTION

In a preferred embodiment of the invention, to be described hereinbelow in detail, there is provided a high-performance clamp device formed as part of the IC chip and connected to a terminal point (such as a bond pad) of the chip. This embodiment comprises a two-terminal diode with the anode and cathode in an isolated chip cell. The anode is connected to a supply rail (–V) and the cathode is connected to the lead between a bond pad and the circuit element requiring protection. The diode clamp provides a maximum breakdown voltage of about 12–14 volts, which is appropriate for protecting MOM capacitors.

In the preferred embodiment, the protective device is in an isolated cell of the IC which has in a lower region a buried layer of silicon, heavily doped in this case with P-type dopant. Above that layer is an epitaxial layer, also with P-type dopant. At the outer reaches of the epitaxial layer is an annular (ring-shaped) segment serving as the low resistance current path during an ESD event. This segment comprises P-type dopant but at a higher concentration (P+) than the epi layer. The buried layer, epitaxial layer and P+ annulus serve as the anode of the diode. At the interior central region of the epi layer is a plug which is circular in horizontal section, and concentric with the annular low resistivity region of the anode. This plug serves as the cathode of the diode, and is doped with N-type dopant. Suitable electrical connections are made to the anode and cathode to interconnect it with an IC device having a MOM capacitor to be protected.

DETAILED DESCRIPTION OF A PREFERRED EMBODIMENT

Figure 1:
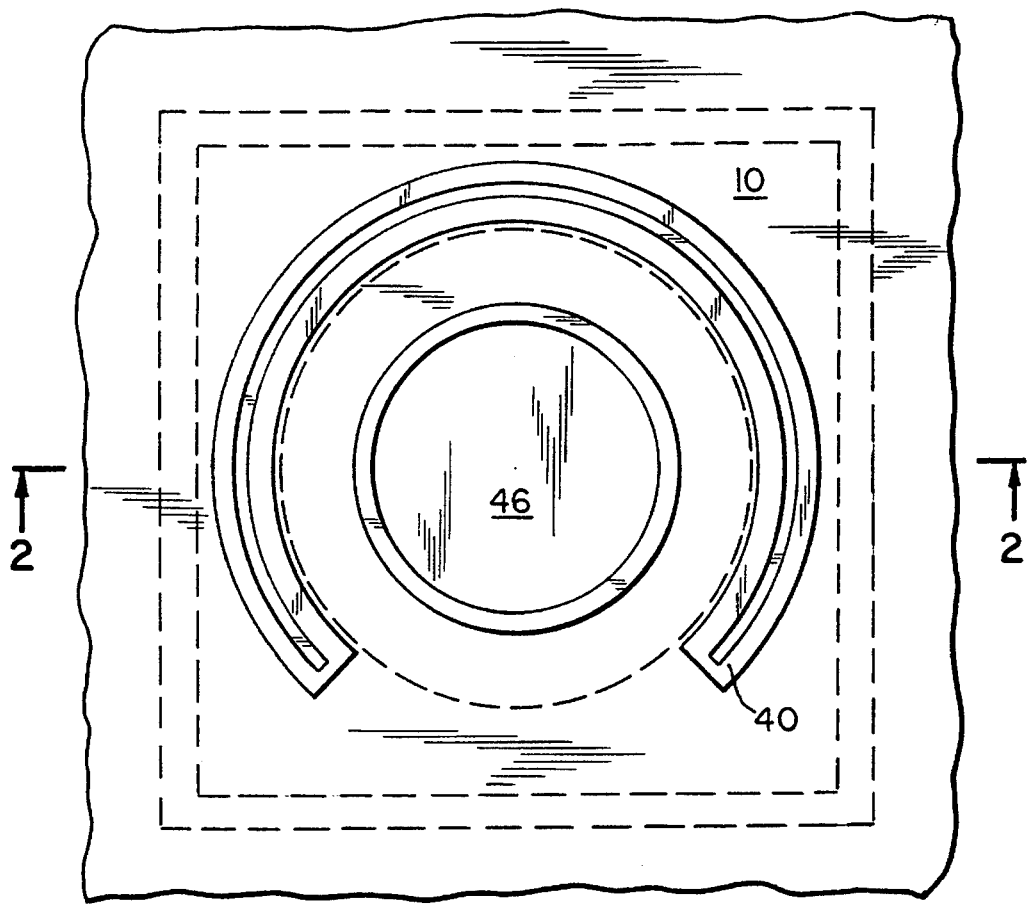
FIG. 1 is a plan view of an IC cell comprising a clamp diode in accordance with the present invention.
Figure 2:
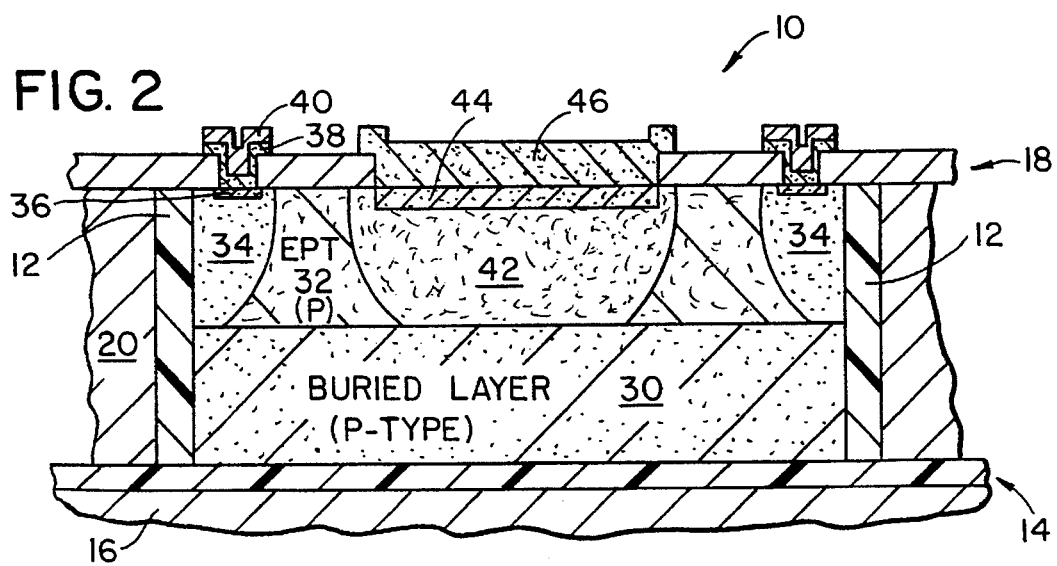
FIG. 2 is a vertical section view of the cell shown in FIG. 1.

Turning first to FIGS. 1 and 2, the IC chip includes a rectangular cell generally identified at 10 and formed with a two-terminal junction clamp device (i.e., a diode) to be described. This cell is surrounded by many other cells of the IC (not shown) formed with devices such as transistors, capacitors and resistors. The interior of the cell 10 is isolated from the rest of the chip by dielectric material.

More specifically, the outer wall 12 of the cell 10 is formed of silicon dioxide in steep-walled trenches forming a rectangle defining the outer limits of the cell. The horizontal bottom of the cell comprises an oxide insulation layer 14 (i.e., "buried oxide") which is formed on the upper surface of a P-type silicon substrate 16 (not completely shown), sometimes referred to as the "handle" of the chip. The upper surface of the cell is formed of field oxide 18 for the chip. Any inactive regions 20 outside of the trenches (sometimes referred to as "ROT") typically are tied to a supply rail of the chip circuitry.

Within the clamp device cell 10, there is a heavily doped P-type buried layer 30 (sub-collector) on which is grown an epitaxial layer 32 with P-type doping. At the outer reaches of the cell 10 (in a horizontal sense), there is a P-type plug 34 extending in annular (ring-shaped) fashion within and adjacent to the border of the cell. This annular plug has a dopant concentration considerably higher (P+) than that of the epitaxial layer. This plug serves as the low resistance current path of the diode, and preferably is formed by ion implantation of a material such as boron. The implant includes at the top of the plug a partial annular ring 36 of still higher concentration of ions (P++) to assure good ohmic contact with the plug.

Above the anode plug 34 is a polysilicon segment 38 extending through the field oxide 18 to establish electrical connection between the plug and a layer of metallization 40 formed in a groove in the polysilicon. The polysilicon segment and its matching metallization are contoured to match the plug 34 in plan view. This polysilicon segment and metallization extends only part way around the annulus of the plug (see FIG. 1), but establishes effective electrical connection with the plug.

Located centrally within the epitaxial layer 32 is a deep diffused plug 42 which is circular (disc-shaped) in horizontal section and concentric with the annular P+ ring 34. This plug is formed with a heavily doped N-type diffusion and serves as the cathode of the clamp device. This diffusion may for example be an ion implant of phosphorus. Embedded in the upper portion of the diffusion is a shallow circular N++ diffusion 44 concentric with the cathode plug 42 and serving to assure good ohmic contact with the plug.

Figure 3:
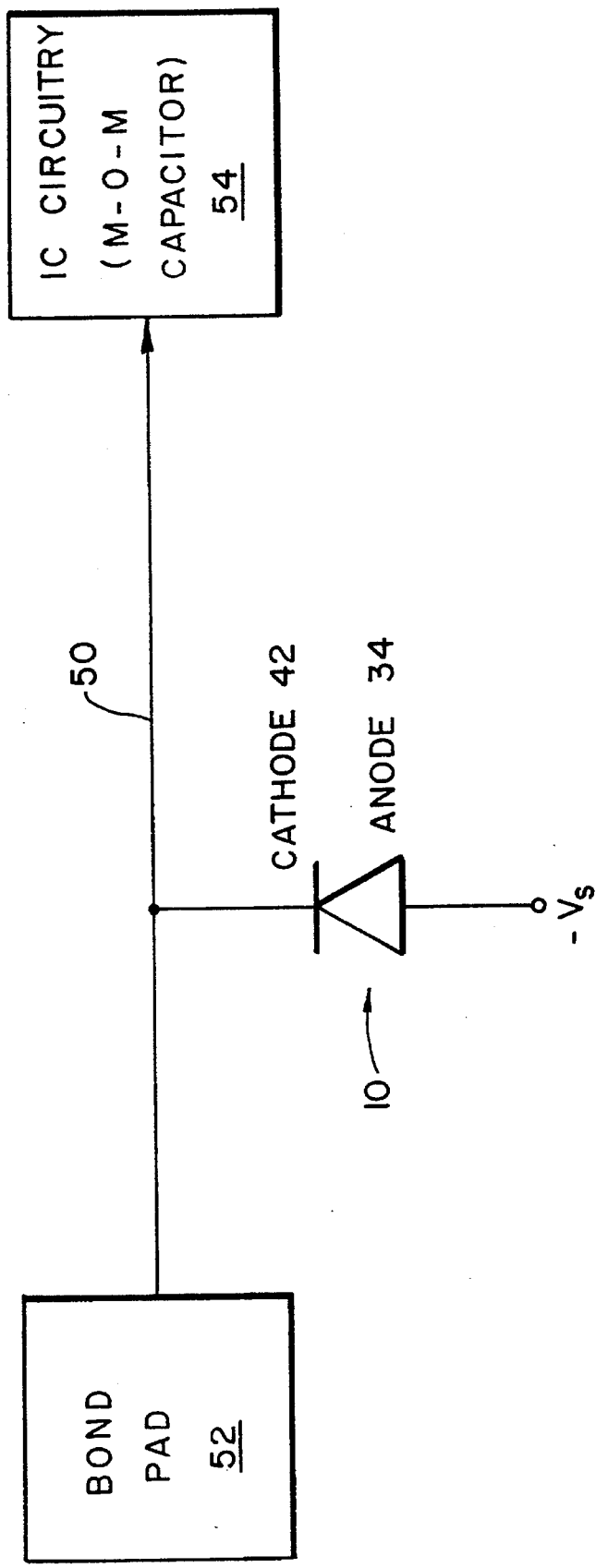
FIG. 3 is a circuit diagram showing the clamp diode connected in shunt fashion to the connection lead between a bond pad and the IC circuitry to be protected from ESD pulses.

A circular polysilicon contact 46 extends through the field oxide 18 to make electrical connection to the cathode diffusion. Metallization (not shown) is formed above and in contact with this polysilicon to provide for external electrical connection between the cathode and the chip circuitry. This is illustrated in FIG. 3, where the cathode 42 of the diode is connected in shunt to the lead 50 extending between a bond pad 52 and the sensitive IC circuitry 54.

When a positive ESD pulse strikes the bond pad 52 and the clamp device cathode 42, the voltage developed across the diode can reach about 12–14 volts as a plateau, thereby protecting the MOM capacitor in the IC circuitry 54. The rounded contours of the diffused anode and cathode regions provide heightened efficiency in carrying out this protective function.

When a negative ESD pulse reaches the clamp device 10, the diode becomes forward biased and will restrict the voltage drop to about 0.6 volts, thus limiting excessive excursion of the pulse voltage.

The ESD diode of this invention utilizes round topographical geometries, deep plug diffusions, and dielectric isolation. The combination of these three features enables the clamp to deliver greater than 2000 V ESD protection while adding minimal parasitic effects to new product circuit designs. Application of the diode plug clamp is intended for use on every bond pad connected to the external environment to shunt harmful ESD charge away from sensitive die circuitry.

In this unique diode design, the round geometrical implant layout reduces current density within the clamp and reduce the breakdown "on" resistance during an ESD event. Additionally the round geometric features enhance electric field spreading and results in greater ESD protection while minimizing ESD cell geometry. The subsurface avalanche junction breakdown between the deep plug diffusion 42 and buried layer diffusion 30 results in larger electric field capability and lower breakdown series "on" resistance than surface breakdown junctions. Subsurface breakdowns have been shown to be more stable over time than surface breakdown junctions. Minimal parasitic capacitance (i.e., 90 fF for 16 μm diameter plug diffusion) is achieved. Isolation capacitance (Cjs) is nulled with a connection of the cathode terminal to the region outside of the trench. During normal operation, the clamp is "off" (i.e., typical leakage current of 1 pA to 10 pA over the maximum voltage operating range).

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An integrated-circuit (IC) chip comprising circuitry with elements such as transistors and including capacitors, said circuitry being connected by a lead to an external terminal point of said IC chip, said IC chip further being formed with a clamp device to prevent damage to any capacitor element of said circuitry from electrostatic discharge (ESD) striking said terminal point, said clamp device comprising a diode with anode and cathode and being formed during the process of forming the chip including:

isolation means defining a region for said clamp device;

said region including a silicon region with dopant of one type;

said silicon region including an annular plug with dopant of said one type extending around the outer reaches of said region to serve as a low resistance current path for the anode;

said silicon region further including a plug of circular cross section interiorly of and concentric with said annular plug, said circular-section plug being formed with dopant of type opposite said one type to serve the function of a cathode;

first contact means centrally located interiorly of said silicon region to establish one contact for making electrical connection to said circular plug;

means to establish a second contact to make electrical connection to said annular plug;

means connecting one of said contacts to a low-impedance bus; and means connecting the other of said contacts to said lead between said terminal point and said IC circuitry so as to intercept and shunt to said low-impedance bus electrostatic pulse energy received from said terminal point thereby to provide for dissipation of the ESD energy to prevent it from damaging said IC circuitry.

2. An IC chip as claimed in claim 1, wherein said region comprises a buried layer heavily doped with said one type of dopant and an epitaxial layer over said buried layer lightly doped with said one type of dopant;

said annular and circular plugs being formed in said epitaxial layer.

3. An IC chip as claimed in claim 2, wherein said annular plug is doped with higher concentration dopant than said epitaxial layer.

4. An IC chip as claimed in claim 2, wherein the dopant densities of the buried layer region of the anode and the deep diffused region of the cathode are sufficiently high to achieve subsurface avalanche breakdown, thereby effecting larger electric field capability than surface breakdown junctions.

5. An IC chip as claimed in claim 1, including an annularly-shaped segment adjacent the upper surface of said annular plug and comprising dopant of said one type to provide for good electrical connection between said second contact and said plug.

6. An IC chip as claimed in claim 1, wherein said low-impedance bus is a power supply line.

7. An IC chip as claimed in claim 1, wherein said circular plug has embedded in its upper surface a shallow circular diffusion with dopant of said opposite type to provide good electrical connection between said first contact means and said circular plug.

8. An IC chip as claimed in claim 1, wherein the circularity of said annular plug and said concentric circular plug acts to provide a low series on-resistance during an ESD event, and produces electric fields of less intensity than those normally associated with rectangular geometries.

* * * * *